United States Patent [19]
Hughes

[11] 3,984,779
[45] Oct. 5, 1976

[54] REMOTE CONTROL APPARATUS FOR CHANNEL SELECTOR

[76] Inventor: Joe L. Hughes, 4981 Lake Fjord Pass, Marietta, Ga. 30060

[22] Filed: May 27, 1975

[21] Appl. No.: 580,956

[52] U.S. Cl. ............................... 325/393; 74/10 A; 178/DIG. 15; 325/471; 334/9
[51] Int. Cl.² ........................................... H04B 1/06
[58] Field of Search ................... 325/393, 390–392, 325/394, 471; 334/8, 9, 20; 178/DIG. 15; 74/10 A

[56] References Cited
UNITED STATES PATENTS

| | | | |
|---|---|---|---|
| 2,815,444 | 12/1957 | Messner | 325/471 |
| 3,054,957 | 9/1962 | Shook | 325/393 |
| 3,290,602 | 12/1966 | Hayden et al. | 325/393 |

*Primary Examiner*—Robert L. Griffin
*Assistant Examiner*—Marc E. Bookbinder
*Attorney, Agent, or Firm*—James B. Middleton

[57] ABSTRACT

A remote control apparatus for operating the channel selector of a television receiver, the apparatus comprising a drive motor connected to a gear reducer, the gear reducer being drivingly connected to the shaft of the channel selector, a switch for the drive motor, the switch being at the end of a length of cord to allow the switch to be located remotely of the receiver, and a stabilizing means to prevent rotation of the gear reducer with respect to the receiver.

1 Claim, 5 Drawing Figures

U.S. Patent  Oct. 5, 1976  3,984,779
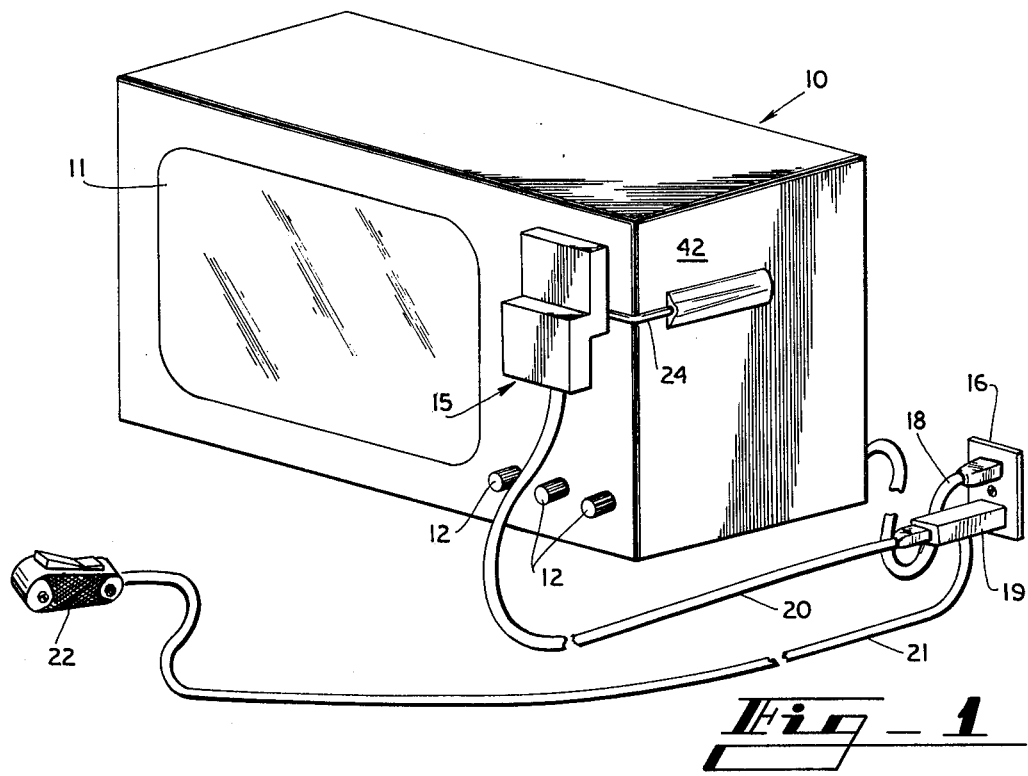
Fig_1
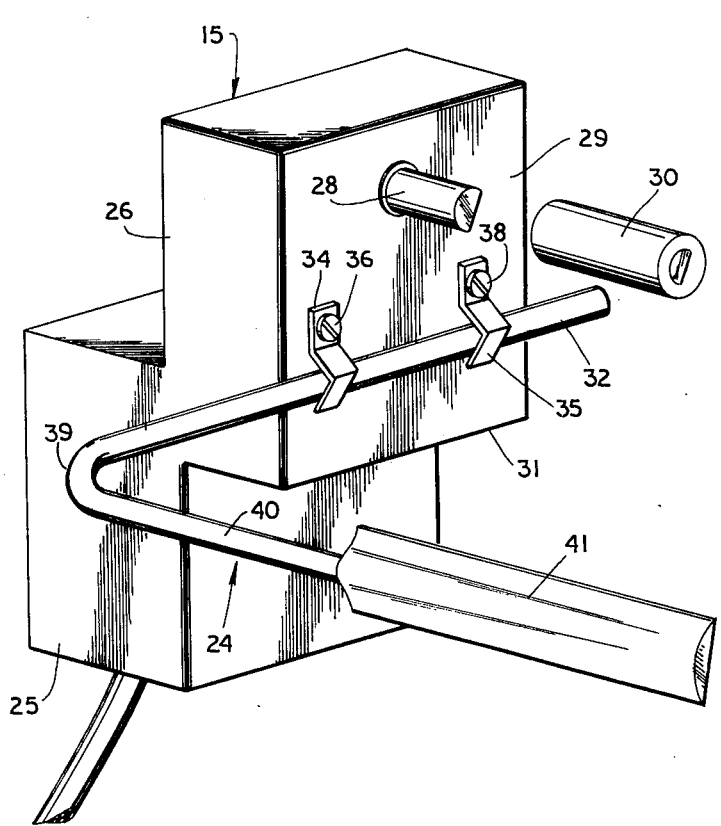
Fig_3
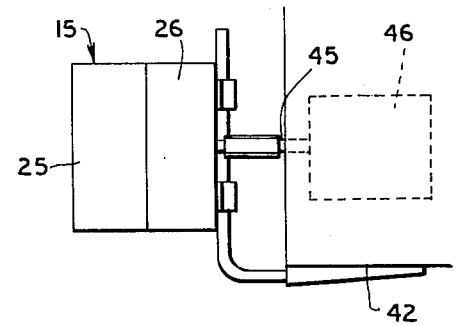
Fig_2
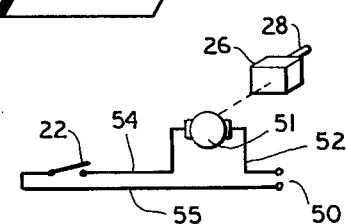
Fig_4
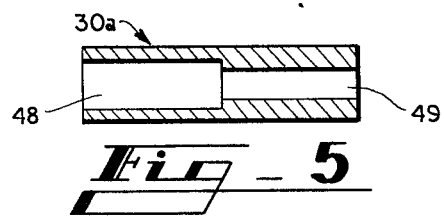
Fig_5

REMOTE CONTROL APPARATUS FOR CHANNEL SELECTOR

This invention relates to remote control apparatus, and is more particularly concerned with remote channel selecting means for television receivers.

Remote control apparatus for television receivers has become quite popular, and various functions can be controlled remotely from the receiver. The principal difficulty encountered with the prior art remote control apparatus is the necessity that the actual control unit be installed within the cabinet of the receiver, and that the remote unit be matched in design to the control unit. Since the control unit must be installed within the cabinet, it will be understood that a competent technician is required, alternatively that the apparatus be installed during manufacture of the television receiver. Furthermore, since the remote unit must be matched to the control unit, and each individual manufacturer utilizes a different remote control apparatus, a person cannot retain his remote unit if he exchanges his television receiver for a different brand having a different variety of control unit therein. The result of all these difficulties is that the remote control apparatus for a television receiver in accordance with the prior art tends to be relatively expensive, yet must be disposed of when the television receiver is disposed of.

The apparatus of the present invention overcomes the above mentioned and other difficulties with the prior art remote control apparatus by providing a drive means having an output shaft, the output shaft being selectively fixable to the input shaft of the channel selector of a television receiver or the like. A coupling is provided by which the output shaft of the drive means is connected to the shaft of the channel selector, and this coupling can be varied when required to adapt a single drive means to substantially any television receiver. A remote operating means is provided to operate the drive means as desired. The apparatus for the present invention is therefore simple in construction and efficient in operation, and can be easily installed on and removed from substantially any television receiver.

These and other features and advantages of the present invention will become apparent from consideration of the following specification when taken in conjunction with the accompanying drawings in which:

FIG. 1 is a perspective view of a conventional television receiver and showing one form of apparatus made in accordance with the present invention installed thereon;

FIG. 2 is an enlarged top plan view showing the apparatus illustrated in FIG. 1;

FIG. 3 is an enlarged perspective view of the control unit illustrated in FIGS. 1 and 2, and showing the coupling exploded therefrom;

FIG. 4 is a schematic electrical circuit for the apparatus illustrated in FIG. 1; and, FIG. 5 is a longitudinal cross-sectional view illustrating a coupling.

Referring now more particularly to the drawings, and to that embodiment of the invention here chosen by way of illustration, FIG. 1 of the drawings illustrates a television receiver 10 having a screen 11 and a plurality of control knobs 12. The channel selector has the control unit generally designated at 15 attached thereto, and the control unit 15 will be discussed in more detail hereinafter.

FIG. 1 also shows an electrical convenience outlet 16 with the cord 18 from the television receiver 10 plugged into one of the outlets, and a plug 19 in the other outlet. The plug 19 has one cord 20 leading therefrom to the control unit 15; and, another cord 21 leads from the plug 19 to a remotely located switch 22.

In general terms, the control unit 15 includes drive means for driving the input shaft of the channel selector of the television receiver 10. As will be discussed in more detail hereinafter, there is a stabilizing arm 24 extending from the control 15 to prevent rotation of the control means 15.

Attention is now directed to FIGS. 2 and 3 of the drawings where it will be seen that the control unit 15 comprises a motor housing 25 fixed to a gear reducer housing 26. While neither the motor nor the gear train itself is shown, both these items are well known to those skilled in the art, and no further discussion is considered to be necessary.

From the upper portion of the gear reducer housing 26, there extends the output shaft 28, the shaft 28 extending substantially perpendicularly from the face 29 of the housing 26 for receiving a coupling 30. Adjacent to the lower edge 31 of the face 29, the transverse arm 32 of the stabilizing means 24 is fixed by a pair of brackets 34 and 35. It will be seen that the brackets 34 and 35 are fixed to the face 29 of the housing 26 by means of screws 36 and 38 respectively so that by selective loosening of the screws 36 and 38, the brackets 34 and 35 will be loosened and allow the arm 32 to be slid back and forth as required.

The arm 32 extends beyond the housing 26 and is provided with a right angle bend 39 to produce a longitudinal arm 40; and, at the extending end of the arm 40 there is a sheath 41. The sheath 41 may be of substantially any material, the object of the sheath 41 being to act as a protective pad to engage the side 42 of the television receiver 10 and prevent the arm 40 from scratching or scuffing the finish on the television receiver 10.

FIG. 2 of the drawings shows the control unit 15 mounted on the television receiver 10. It should here be noted that the coupling 30 is received over the output shaft 28 of the gear reducer 26, and the opposite end of the coupling 30 is received over the input shaft 45 of the channel selector 46. This arrangement provides the driving arrangement between the control apparatus 15 and the channel selector 46, and also supports the control unit. It should therefore be understood that, when the motor 25 is energized, driving the gear reducer 26, the output shaft 28 will be rotated to rotate the coupling 30. The coupling 30 will then rotate the shaft 45 of the channel selector 46 as long as the motor 25 is energized.

Since the control unit 15 is carried entirely by the input shaft 45, the tendency would be for the control unit 15 to rotate rather than causing rotation of the input shaft 45; therefore, the stabilizing arm 24 is provided to prevent rotation of the control unit 15. It will be readily recognized that not all television receivers are constructed precisely alike; hence, the stabilizing arm 24 must be variable. Furthermore, those skilled in the art will realize that the pad 41 does not have to be against the side 42, but it may be placed against any portion of the receiver adjacent to the shaft 45 of the channel selector.

In connecting the shaft 45 to the drive shaft 28, it will be recognized that most channel selectors such as the channel selector 46 have a standard size and style of input shaft such as the shaft 45 so that one coupling 30 can be used for most television receivers. In the event a different form of shaft 45 is found, a coupling such as that shown in FIG. 5 can be used, which is an adapter coupling 30A. Here it will be seen that the coupling 30A has a first bore 48 and a second bore 49, the two bores 48 and 49 being coaxial but different in formation. The two bores are here shown simply of different sizes, but it will be understood that there may be differences in shape, size or the like, the object being to have one bore to receive the shaft 45 and another bore to receive the shaft 28, both in non-rotatable relation.

Looking now at FIG. 4 of the drawings, the operation of the device should be understood. It will be seen in FIG. 4 that the source of electrical power is at 50, which would be through the plug 19 in the illustration in FIG. 1. The motor 51 is then connected to the power source 50 through a line 52, and through a line 54 that is broken by the switch 22, thence through the line 55 to the power source 50. With this arrangement, when the switch 22 is closed, the motor 51 is connected to the power source 50 so the motor is energized, hence the motor will drive the gear reducer 26 to which it is connected, thereby rotating the shaft 28. As soon as the switch 22 is opened, the motor 51 will be deenergized.

When rotating the shaft 45 of the channel selector 46, the stopping point must be very precise. While electric motors normally tend to coast to a stop, or have some over-run, such over-run is made negligible in the present apparatus. It is contemplated that the motor 51 will be a simple synchronous motor having a speed (assuming 60 Hz. alternating current) of 3600 RPM. Thus, to reduce the speed to 5 RPM will require a 720 times reduction. Any over-run of the motor 51 will therefore be reduced 720 times before being applied to the shaft 45. Since the motor 51 is relatively small and the rotor will have low mass, there will be very little over-run, and when so reduced there will be no noticeable affect on the channel selector 46.

It will of course be understood by those skilled in the art that the embodiment of the invention here presented is by way of illustration only, and is meant to be in no way restrictive; therefore, numerous changes and modifications may be made, and the full use of equivalents resorted to without departing from the spirit or scope of the invention as defined by the appended claims.

I claim:
1. Remote control apparatus for remotely positioning a shaft, comprising a television receiver including a channel selector within said television receiver, said channel selector having an input shaft for operating said channel selector, said input shaft extending outwardly of said television receiver and having a noncircular extending end, a coupling having a first end engageable with said noncircular extending end of said input shaft, said coupling defining a complementary opening for receiving said input shaft, drive means adjacent to said television receiver, said drive means having an output shaft having a noncircular extending end, said coupling defining a second opening complementary to said noncircular extending end of said output shaft, said second opening being coaxial with said opening for supporting said output shaft coaxially with said input shaft, said drive means including an electric motor, a speed reducer drivingly connected to said electric motor, said speed reducer having a shaft which constitutes said output shaft, said drive means being so constructed and arranged that said drive means is supported by said output shaft through the connection to said input shaft by means of said coupling, stabilizing means for preventing rotation of said drive means with respect to said television receiver during operation of said electric motor, said stabilizing means including a first arm adjustably fixed to said driving means, said first arm being disposed perpendicular to said output shaft, said first arm being selectively movable axially, a second arm carried by said first arm substantially at a right angle with respect to said first arm such that said second arm is generally parallel to said output shaft, said stabilizing means being so constructed and arranged that said second arm extends adjacent to a side of said television receiver and said first arm is adjustable to cause said second arm to engage said side of said television receiver, and a pad carried by said second arm for engaging said television receiver, and remote means for selective operation of said electric motor, said remote means including a remote switch, a first wire connecting said electric motor to a source of electric power, a second wire connecting said electric motor to said switch, and a third wire connecting said switch to said source of electric power.

* * * * *